United States Patent [19]

Bergemont

[11] Patent Number: 5,789,791
[45] Date of Patent: Aug. 4, 1998

[54] MULTI-FINGER MOS TRANSISTOR WITH REDUCED GATE RESISTANCE

[75] Inventor: Albert M. Bergemont, Palo Alto, Calif.

[73] Assignee: National Semiconductor Corporation, Santa Clara, Calif.

[21] Appl. No.: 749,425

[22] Filed: Nov. 15, 1996

Related U.S. Application Data

[63] Continuation-in-part of Ser. No. 703,547, Aug. 27, 1996.
[51] Int. Cl.$^6$ .......................... H01L 27/10; H01L 29/80; H01L 29/76; H01L 23/48
[52] U.S. Cl. .......................... 257/401; 257/204; 257/205; 257/211; 257/266; 257/270; 257/287; 257/365; 257/381; 257/386; 257/401; 257/748; 257/758; 257/773; 257/774; 257/905; 257/909; 257/920
[58] Field of Search .......................... 257/204, 211, 257/401, 758, 205, 748, 773, 774, 905, 909, 920, 266, 270, 287, 365, 381, 386

[56] References Cited

U.S. PATENT DOCUMENTS

| | | | |
|---|---|---|---|
| 5,581,097 | 12/1996 | Nariishi | 257/758 |
| 5,598,009 | 1/1997 | Bui | 257/365 |
| 5,598,029 | 1/1997 | Suzuki | 257/758 |

OTHER PUBLICATIONS

Saito, M. et al., "*Advantage of Small Geometry Silicon MOSFETs for High-Frequency Analog Applications under Low Power Supply Voltage of 0.5v.*" 1995 Symposium on VLSI Technology Digest of Technical Papers, pp. 71–72.

Voinigescu, S.P., et al. "*An Assessment of the State-of-the-Art 0.5 μm Bulk CMOS Technology for RF Applications.*" IEDM (1995) pp. 721–724.

Primary Examiner—Mahshid D. Saadat
Assistant Examiner—Ida Marie Soward
Attorney, Agent, or Firm—Limbach & Limbach L.L.P.

[57] ABSTRACT

The gate resistance of a high-frequency multi-finger MOS transistor is reduced by shorting together the ends of each of the gates by utilizing gate contacts, metal regions, vias, and a metal layer. Alternately, the gate resistance is reduced by utilizing a metal line that shorts all of the gate contacts together, and overlies each of the gates. By reducing the gate resistance, the maximum frequency $f_{MAX}$ of the multi-finger transistor can be increased.

14 Claims, 4 Drawing Sheets

MULTI-FINGER MOS TRANSISTOR WITH REDUCED GATE RESISTANCE

RELATED APPLICATION

This application is a continuation-in-part of Ser. No. 08/703,547 filed Aug. 27, 1996 by Albert Bergemont for A POLYSILICON GATE MOS TRANSISTOR STRUCTURE AND METHOD FOR MAKING.

BACKGROUND OF THE INVENTION

1. Field of the Invention

The present invention relates to multi-finger MOS transistors and, more particularly, to high-frequency, multi-finger MOS transistors with reduced gate resistance.

2. Description of the Related Art

To increase the maximum oscillation frequency $f_{MAX}$ of a poly-gate MOS transistor, conventional high-frequency MOS transistors employ a multi-finger structure which utilizes multiple gates rather than a single gate. By utilizing multiple gates, the gate resistance can be significantly reduced which, in turn, increases the $f_{MAX}$ of the transistor.

FIG. 1 shows a plan view of a conventional high-frequency multi-finger MOS transistor 10. As shown in FIG. 1, transistor 10 includes a plurality of source regions 12, a plurality of drain regions 14, and a plurality of channel regions 16 which are formed in an active region 18 of a semiconductor substrate.

In addition, the drain regions 14 are formed so that one drain region 14 is located between each adjacent pair of source regions 12, while the channel regions 16 are formed so that one channel region 16 is located between each adjacent pair of source and drain regions 12 and 14.

Further, transistor 10 also includes a plurality of gate oxide regions (not shown) formed over the channel regions 16, a plurality of poly gates 22 formed over the gate oxide regions, and a plurality of poly gate connecting regions 24 that connect together the ends of the poly gates 22.

The $f_{MAX}$ of transistor 10 is defined by the equation:

EQ. 1

$$F_{MAX} = f_T/2[2\pi f_T C_{gd} + g_o(R_s+R_g)]^{1/2},$$

where $f_T$ represents the cutoff frequency, $C_{gd}$ represents the gate-to-drain capacitance, $g_o$ represents the output conductance, $R_s$ represents the source resistance, and $R_g$ represents the gate resistance. Thus, as shown by equation 1, $f_{MAX}$ can be increased by reducing the gate resistance $R_g$.

The gate resistance $R_g$, in turn, is defined by the equation:

EQ. 2

$$R_g = R_p W/n^2 L_g,$$

where $R_p$ represents the poly sheet resistance of the gates, W represents the total width of the gates, n represents the number of fingers, and $L_g$ represents the length of a single gate. In addition, $W=L_f n$ where $L_f$ represents the width of one finger.

Thus, for a device with a fixed width $L_f$ and a fixed length $L_g$, $R_g$ can be reduced by reducing the sheet resistance $R_p$ or by increasing the number of fingers n. Due to the increased die size that results from utilizing additional fingers, techniques which reduce the sheet resistance $R_p$ of the gates are favored over the use of more fingers.

FIG. 2 shows a graph that illustrates the relationship between $f_{MAX}$ and the sheet resistance $R_p$ of the gates. As shown in FIG. 2, $f_{MAX}$ noticeably begins to increase when the sheet resistance falls to approximately 750Ω. However, as further shown in FIG. 2, $f_{MAX}$ does not exceed the cutoff frequency $f_T$ (approximately 38 GHz) until the sheet resistance $R_p$ falls below approximately 100Ω.

One technique for reducing the sheet resistance $R_p$ of the gates is to short the gate connecting regions 24 of FIG. 1 so that all of the gate connecting regions 24 on one side of active region 18 are electrically connected together, and all of the gate connecting regions 24 on the opposite side of active region 18 are electrically connected together. By shorting together the connecting regions 24, the sheet resistance $R_p$ of the gates drops by about a factor of ten.

FIG. 3 shows a plan view of a conventional high-frequency multi-finger MOS transistor 30 with shorted gate connecting regions 24 on each side of active region 18. As shown in FIG. 3, MOS transistor 30 differs from transistor 10 in FIG. 1 only in that transistor 30 also includes a first metal strap 32 which electrically connects the gate connecting regions 24 on one side of active region 18 via contacts 34, and a second metal strap 36 which electrically connects the gate connecting regions 24 on the opposite side of active region 18 via contacts 38.

Although metal straps 32 and 36 significantly reduce the gate resistance $R_g$, and thereby increase the $f_{MAX}$ of transistor 30, additional techniques are needed to further reduce the gate resistance $R_g$ of the gates.

SUMMARY OF THE INVENTION

Conventionally, the gate resistance of a multi-finger MOS transistor is reduced by shorting together the ends of the gates on one side of the active region, and by shorting together the ends of the gates on the opposite side of the active region. In the present invention, the gate resistance of a multi-finger MOS transistor is further reduced by shorting together the ends of all of the gates.

The multi-finger MOS transistor of the present invention, which is formed in a semiconductor substrate, includes an active region defined in the substrate, and a plurality of spaced-apart source regions formed in the active region. In addition, a plurality of spaced-apart drain regions are formed in the active region so that one drain region is formed between each adjacent pair of source regions, while a plurality of spaced-apart channel regions are formed in the active region so that one channel region is formed between each adjacent pair of source and drain regions.

The MOS transistor of the present invention also includes a layer of gate oxide formed over each channel region, and a plurality of gates formed over the plurality of channel regions on the layer of gate oxide so that a gate is formed over each channel region. A plurality of gate connecting regions connect together the ends of the gates outside of the active region so that the opposite ends of a gate are connected to the ends of different adjacent gates. Further, a plurality of gate contacts contact the gate connecting regions so that each gate connecting region is connected to a gate contact.

In accordance with the present invention, the MOS transistor additionally includes a metal layer that connects together all of the gate contacts. By connecting together all of the gate contacts, the gate resistance can be further reduced over that of a conventional multi-finger MOS transistor.

In accordance with a first alternative embodiment, a first metal line that shorts all of the gate contacts together, and overlies each of the gates, is used to reduce the gate resistance.

A better understanding of the features and advantages of the present invention will be obtained by reference to the following detailed description and accompanying drawings which set forth an illustrative embodiment in which the principals of the invention are utilized.

DETAILED DESCRIPTION

Figure 1:
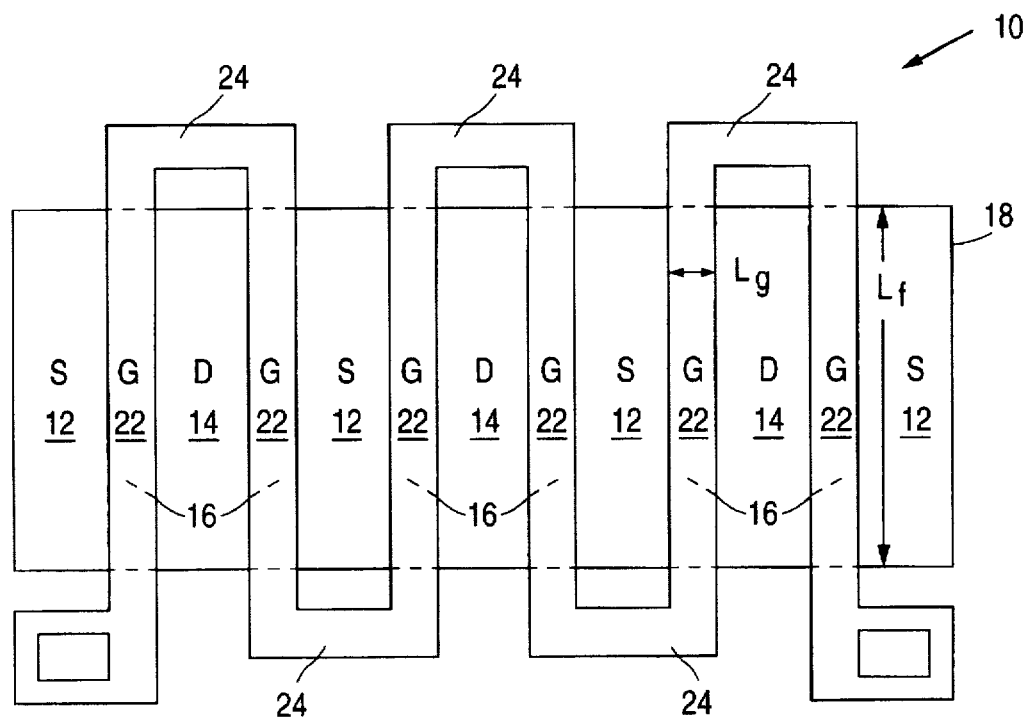
FIG. 1 is a plan view illustrating a conventional high-frequency multi-finger MOS transistor 10.
Figure 2:
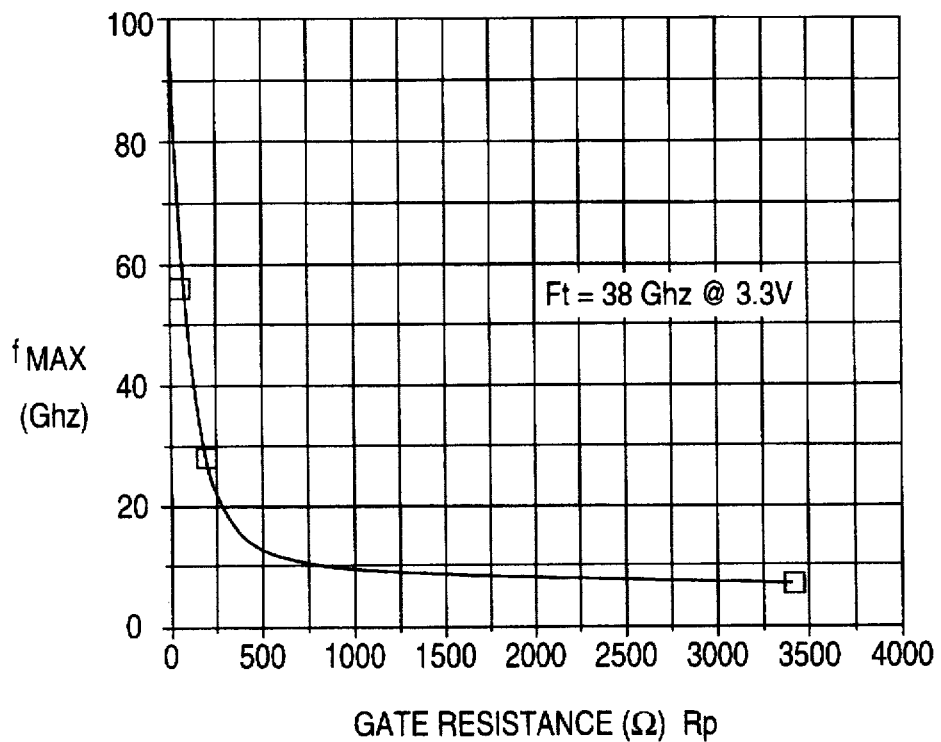
FIG. 2 is a graph illustrating the relationship between $f_{MAX}$ and the sheet resistance $R_p$ of the gates.
Figure 3:
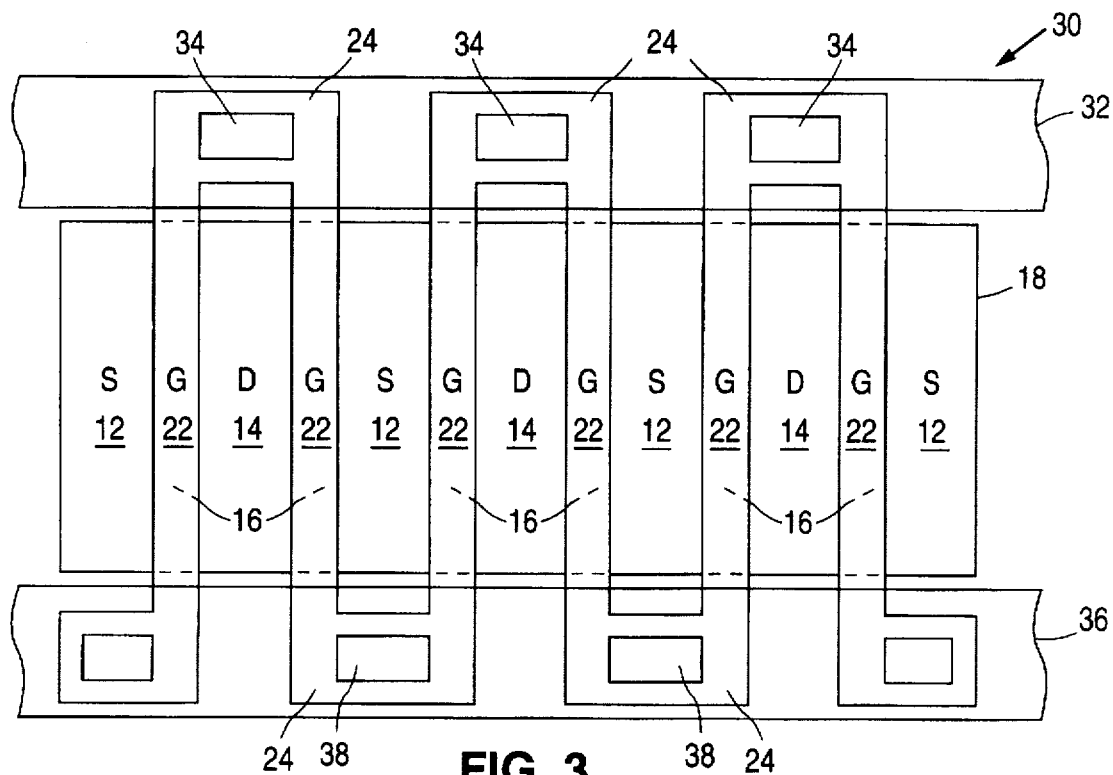
FIG. 3 is a plan view illustrating a conventional high-frequency multi-finger MOS transistor 30 with shorted gate connecting regions 24 on each side of active region 18.
Figure 4:
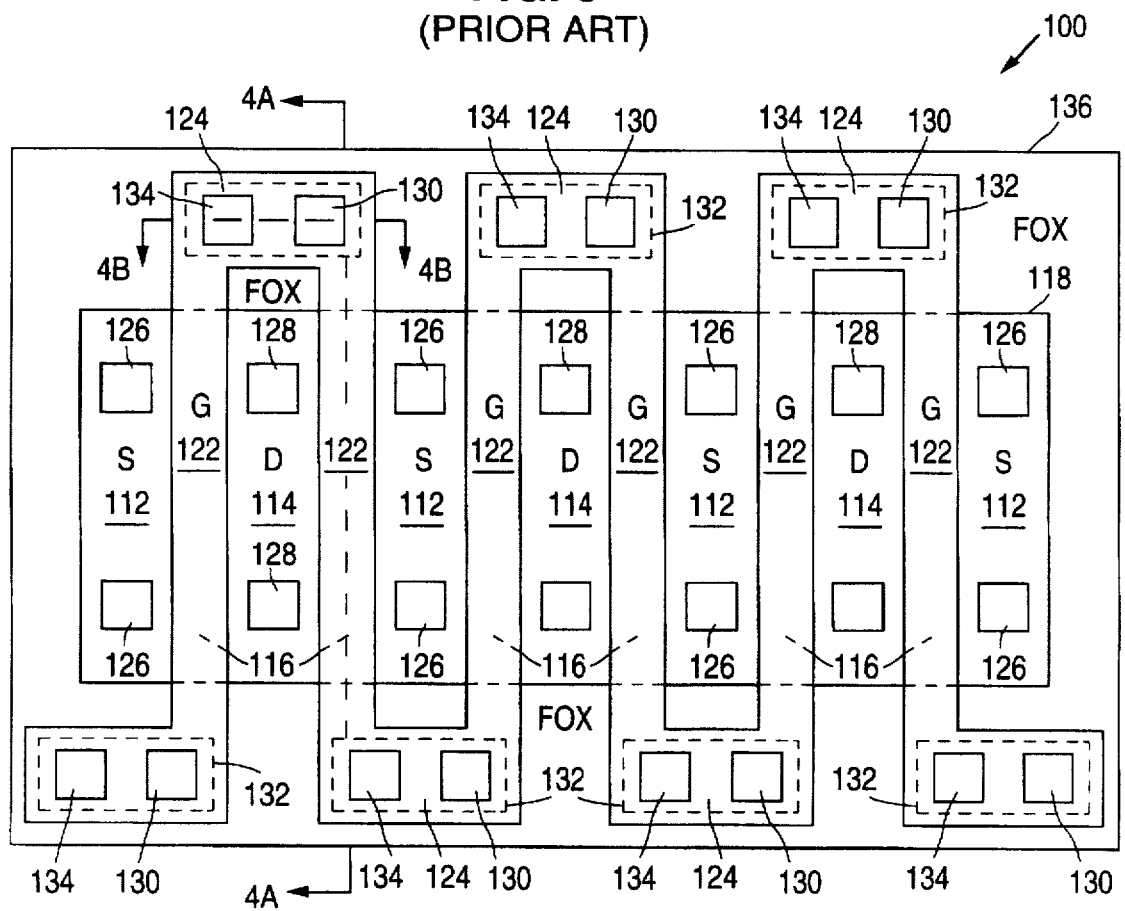
FIG. 4 is a plan view illustrating a multi-finger MOS transistor 100 in accordance with the present invention.
Figure 5A:
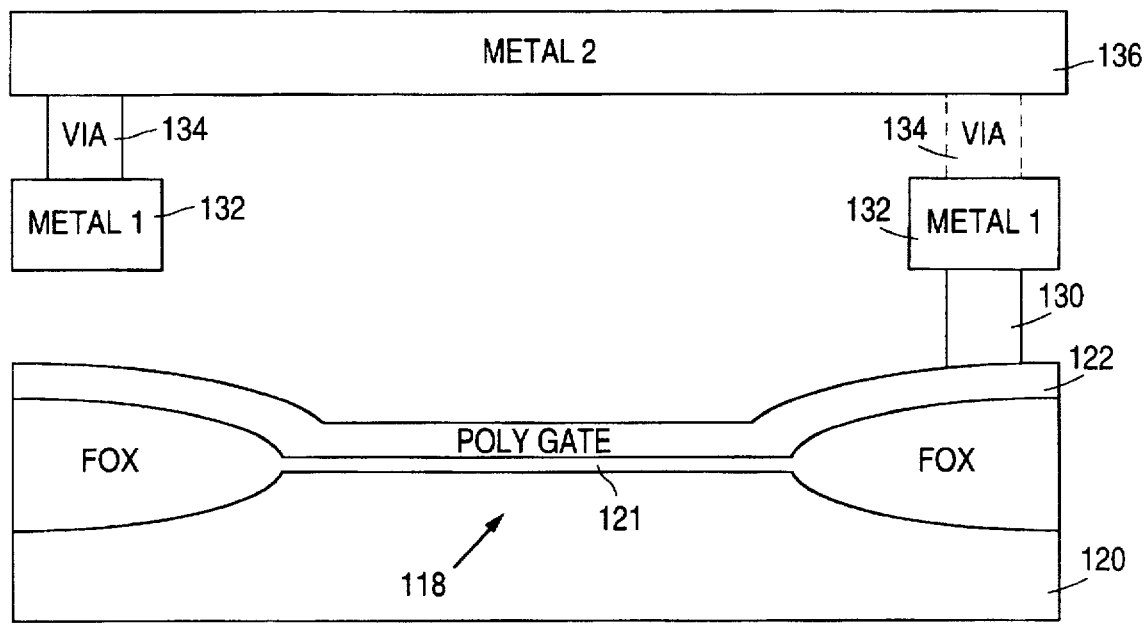
FIGS. 5A–5B are cross-sectional diagrams taken along lines 4A—4A and 4B—4B, respectively.
Figure 5B:
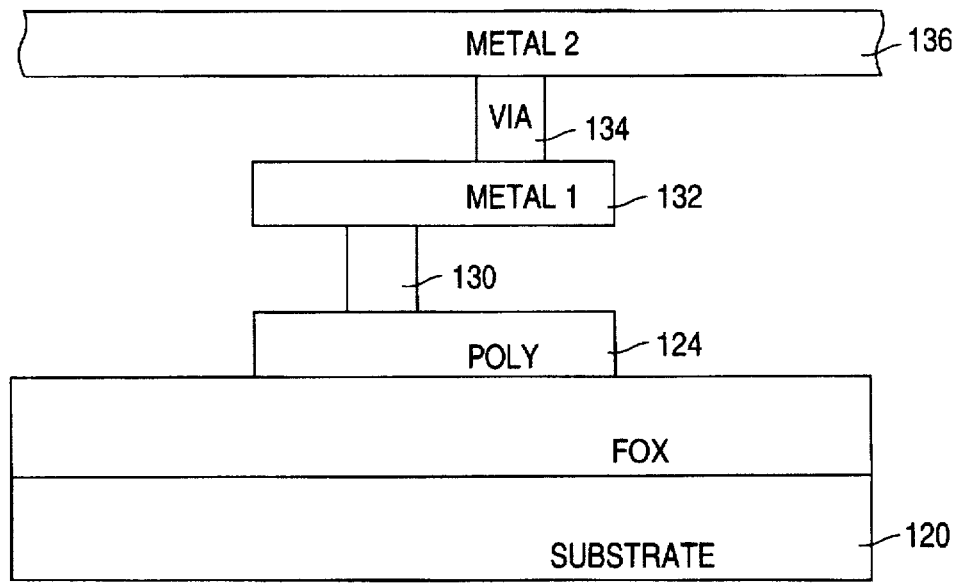

FIG. 4 shows a plan view that illustrates a multi-finger MOS transistor 100 in accordance with the present invention. FIGS. 5A–5B show cross-sectional diagrams taken along lines 4A—4A and 4B—4B, respectively.

As shown in FIG. 4, 5A, or 5B, transistor 100 includes a plurality of source regions 112, a plurality of drain regions 114, and a plurality of channel regions 116 formed in an active region 118 of a semiconductor substrate 120. Active region 118, in turn, is surrounded by conventionally-formed field oxide FOX.

In addition, the drain regions 114 are formed so that one drain region 114 is located between each adjacent pair of source regions 112, while the channel regions 116 are formed so that one channel region 116 is located between each adjacent pair of source and drain regions 112 and 114.

As shown in FIGS. 4, 5A, or 5B, transistor 100 also includes a plurality of gate oxide regions 121 formed on the channel regions 116, a plurality of poly gates 122 formed over the plurality of channel regions 116 on the gate oxide regions 121, and a plurality of gate connecting regions 124 that connect together the ends of the gates 122 outside of active region 118 so that the opposite ends of a gate 122 are connected to the ends of different adjacent gates 122.

In addition, transistor 100 further includes a plurality of source contacts 126 that contact the source regions 112, a plurality of drain contacts 128 that contact the drain regions 114, and a plurality of gate contacts 130 that contact the gate connecting regions 124.

In accordance with the present invention, transistor 100 also includes a plurality of first metal regions 132 connected to the gate contacts 130, a plurality of vias 134 connected to the first metal regions 132, and a second metal region 136 that connects together all of the vias 134.

The advantage of the present invention, as shown in FIG. 5A, is that by shorting together all of the gate contacts 130 via the vias 134, the gate resistance $R_g$ can be reduced even further, thereby further increasing the $f_{MAX}$ of transistor 100.

Figure 6:
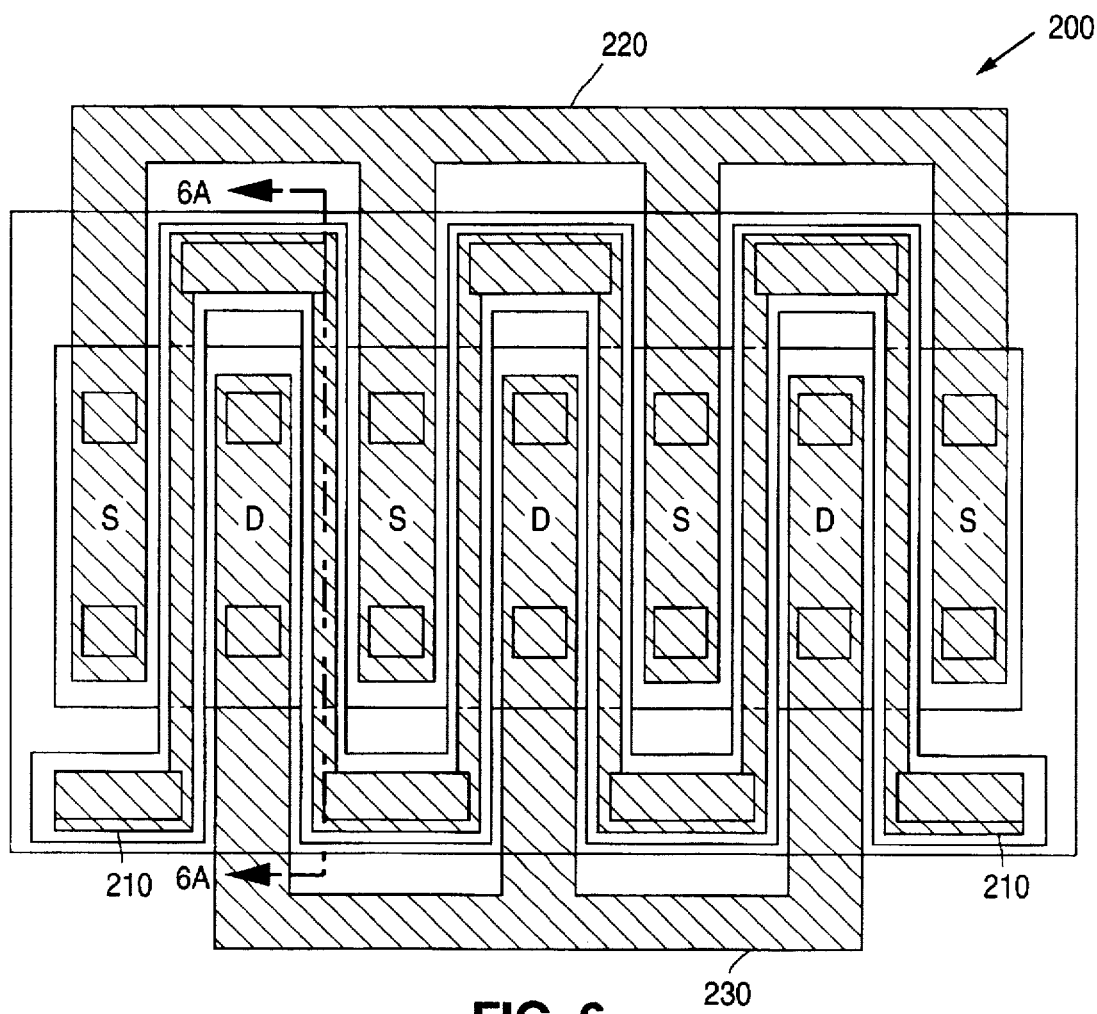
FIG. 6 is a plan view illustrating a multi-finger MOS transistor 200 in accordance with a first alternative embodiment of the present invention.
Figure 7:
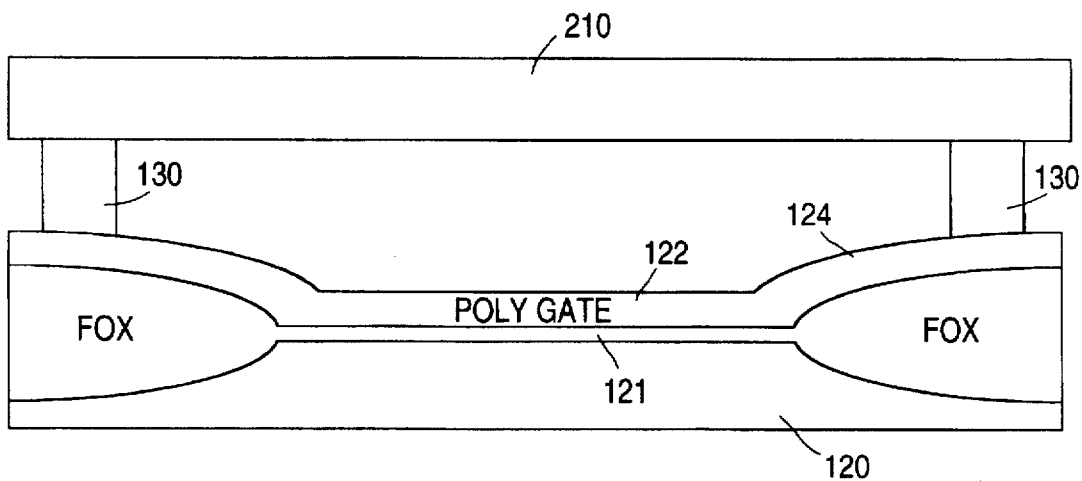
FIG. 7 is a cross-sectional diagram taken along line 6A—6A.

FIG. 6 shows a plan view that illustrates a multi-finger MOS transistor 200 in accordance with a first alternative embodiment of the present invention. FIG. 7 shows a cross-sectional diagram taken along line 6A—6A.

As shown in FIG. 6, transistor 200 is the same as transistor 100 except that the first metal regions 132, the vias 134, and the second metal region 136 have been replaced with a first metal line 210 that shorts together each of the gate contacts 130 and overlies each of the gates 122.

In addition, the layer of metal used to form first metal line 210 can also be simultaneously patterned to form a second metal line 220 that shorts together the source contacts 126, and a third metal line 230 that shorts together the drain contacts 128.

As further shown in FIG. 6, the second metal line 220 has a comb-shape with lines extending in a first (downward) direction, while the third metal line 230 also has a comb-shape with lines extending in a second (upward) direction that is opposite to the first direction. (The layout of the second and third metal lines 220 and 230 can also be used with transistor 100 in FIG. 4 to connect the source and drain contacts, respectively).

In addition, the lines extending downward of the second metal line 220 are interposed between the lines extending upward of the third metal line 230. The first metal line 210, in turn, has a serpentine-shape that fits between the interposed second and third metal lines 220 and 230.

The advantage of utilizing the layout shown in FIG. 6 is that, in addition to reducing the gate resistance, the first, second, and third metal lines 210, 220, and 230 can be formed from a single layer of metal, thereby simplifying the fabrication process.

It should be understood that various alternatives to the embodiment of the invention described herein may be employed in practicing the invention. Thus, it is intended that the following claims define the scope of the invention and that methods and structures within the scope of these claims and their equivalents be covered thereby.

What is claimed is:

1. A transistor formed in a semiconductor substrate, the transistor comprising:

an active region defined in the substrate;

a plurality of spaced-apart source regions formed in the active region;

a plurality of spaced-apart drain regions formed in the active region so that a drain region is formed between each adjacent pair of source regions;

a plurality of spaced-apart channel regions defined in the active region so that a channel region is defined between each adjacent pair of source and drain regions;

a plurality of gate oxide regions formed over the channel regions so that a gate oxide region is formed over each channel region;

a plurality of gates formed over the gate oxide regions so that a gate is formed over each channel region;

a plurality of gate connecting regions connected to the ends of the gates so that the opposite ends of a gate are connected to the ends of different adjacent gates;

a plurality of gate contacts connected to the gate connecting regions so that a gate contact is connected to each gate connecting region;

a plurality of metal regions corresponding to the plurality of gate contacts, the plurality of metal regions being connected to the gate contacts so that each metal region is connected to a corresponding gate contact;

a plurality of vias connected to the metal regions so that a via is connected to each metal region; and a metal layer connected to all of the vias.

2. The transistor of claim 1 and further comprising a field oxide region formed on the substrate to surround the active region.

3. The transistor of claim 2 wherein the gate connecting regions are formed over the field oxide region.

4. The transistor of claim 1 and further comprising:
- a plurality of source contacts connected to the source regions so that a source contact is connected to each source region;
- a plurality of drain contacts connected to the drain regions so that a drain contact is connected to each drain region;
- a first metal line connected to all of the source contacts; and
- a second metal line connected to all of the drain contacts.

5. The transistor of claim 4 wherein the gate connecting regions are formed from a material that includes polysilicon.

6. The transistor of claim 1 wherein the gates are formed from a material that includes polysilicon.

7. The transistor of claim 1 wherein the gate connecting regions are connected to the ends of the gates outside of the active region.

8. A transistor formed in a semiconductor substrate, the transistor comprising:
- an active region defined in the substrate;
- a plurality of spaced-apart source regions formed in the active region;
- a plurality of spaced-apart drain regions formed in the active region so that a drain region is formed between each adjacent pair of source regions;
- a plurality of spaced-apart channel regions defined in the active region so that a channel region is defined between each adjacent pair of source and drain regions;
- a plurality of gate oxide regions formed over the channel regions so that a gate oxide region is formed over each channel region;
- a plurality of gates formed over the gate oxide regions so that a gate is formed over each channel region;
- a plurality of gate connecting regions connected to the ends of the gates so that the opposite ends of a gate are connected to the ends of different adjacent gates;
- a plurality of gate contacts connected to the gate connecting regions so that a gate contact is connected to each gate connecting region; and
- a first metal line that shorts all of the gate contacts together, and overlies each of the gates.

9. The transistor of claim 8 and further comprising:
- a plurality of source contacts connected to the source regions so that a source contact is connected to each source region;
- a plurality of drain contacts connected to the drain regions so that a drain contact is connected to each drain region;
- a second metal line connected to all of the source contacts; and
- a third metal line connected to all of the drain contacts.

10. The transistor of claim 9 wherein the second metal line has fingers extending in a first direction, and the third metal line has fingers extending in a second direction opposite from first direction that are interposed between the fingers of the second metal line.

11. The transistor of claim 6 wherein the first metal line has a serpentine-shape that fits between the interposed fingers of the second and third metal lines.

12. The transistor of claim 8 and further including a field oxide region formed on the substrate to surround the active region.

13. The transistor of claim 12 wherein the gate connecting regions are formed over the field oxide region.

14. The transistor of claim 8 wherein the gate connecting regions are connected to the ends of the gates outside of the active region.

* * * * *